United States Patent [19]
Arai

[11] 3,971,985
[45] July 27, 1976

[54] AUTOMATIC CONTROL SYSTEM FOR CONDITION-RESPONSIVELY SWITCHING OVER TRANSCEIVER AND RADIO OR TAPE RECORDER AUDIO SIGNALS

[75] Inventor: Kazuo Arai, Kitamoto, Japan

[73] Assignee: Nissan Denshi Company Limited, Ohmiya, Japan

[22] Filed: Mar. 7, 1975

[21] Appl. No.: 556,491

[30] Foreign Application Priority Data
Nov. 15, 1974 Japan .......................... 49-137575[U]
Dec. 28, 1974 Japan ............................ 49-2433[U]

[52] U.S. Cl. ................................. 325/21; 325/302
[51] Int. Cl.[2] .......................................... H04B 1/40
[58] Field of Search ................ 325/18, 21, 22, 302, 325/303, 304; 179/1 SW, 100.12; 307/253, 254

[56] References Cited
UNITED STATES PATENTS
3,277,374  10/1966  Kobayashi .............................. 325/18
3,745,467   7/1973  Lundquist et al. ................... 325/304

Primary Examiner—Benedict V. Safourek
Attorney, Agent, or Firm—Thomas B. Graham

[57] ABSTRACT

Disclosed is an automatic control system for condition-responsively switching over audio signals from transceiver, radio or tape recorder. It is characterized in that a transceiver squelch control circuit having a transistor is connected through its collector electrode to a radio or tape recorder audio signal switching transistor at the base electrode thereof, thereby voltage variation in the squelch control circuit is transmitted to the radio or tape recorder audio signal switching transistor which in turn functions to switch off the radio or tape recorder audio signal.

2 Claims, 2 Drawing Figures 3,971,985

AUTOMATIC CONTROL SYSTEM FOR CONDITION-RESPONSIVELY SWITCHING OVER TRANSCEIVER AND RADIO OR TAPE RECORDER AUDIO SIGNALS

BACKGROUND OF THE INVENTION

The present invention relates to a transceiver combined with a radio or tape recorder, and more particularly to an automatic control system for condition-responsively switching audio signals from the transceiver and radio or tape recorder.

Prior to the present invention, most transceivers have employed an independent circuit separated from that of a radio or tape recorder, ever when they are incorporated in a single cabinet. Under such condition, when transceiver signals are received while other radio or tape recorder is in operation, reception of the transceiver signals is apt to escape operater's attention. Thus, the operater has had to keep a constant watch over the possible or anticipated transceiver signals. This obviously increases the operater's burden.

SUMMARY OF THE INVENTION

Accordingly, it is an object of the invention to provide an improved automatic control system for condition-responsively switching over audio signals from the transceiver and radio or tape recorder.

Another object of the invention is to provide an improved automatic control system for condition-responsively switching over the audio signals while leaving sufficient time interval for the switching over audio signals, lest the transceiver communication which may be temporarily interrupted should be intervened prematurely by the radio or tape recorder signals.

In accordance with one aspect of the present invention, an automatic control system is provided for condition-responsively switching over audio signals from the transceiver, radio or tape recorder. The automatic control system of the present invention substantially comprises, in combination, a transceiver squelch control circuit which includes a transceiver audio signal switching transistor and a radio or tape recorder audio signal switching circuit which includes a radio or tape recorder audio signal switching transistor which functions reversely to the above transceiver signal switching transistor. And, it is characterized in that the collector electrode of the transceiver audio signal switching transistor is connected to the base electrode of the radio or tape recorder audio signal switching transistor.

In another aspect of the present invention, the automatic control system further comprises a time constant circuit for preventing undesirable premature switching of the audio signals.

BRIEF DESCRIPTION OF THE DRAWING

The features of the invention which are believed to be novel are set forth with particularity in the appended claims. The invention together with its further objects and advantages thereof, may be best understood, however, by reference to the following description taken in conjunction with the accompanying drawings, in which;

PREFERRED EMBODIMENT OF THE INVENTION

Figure 1:
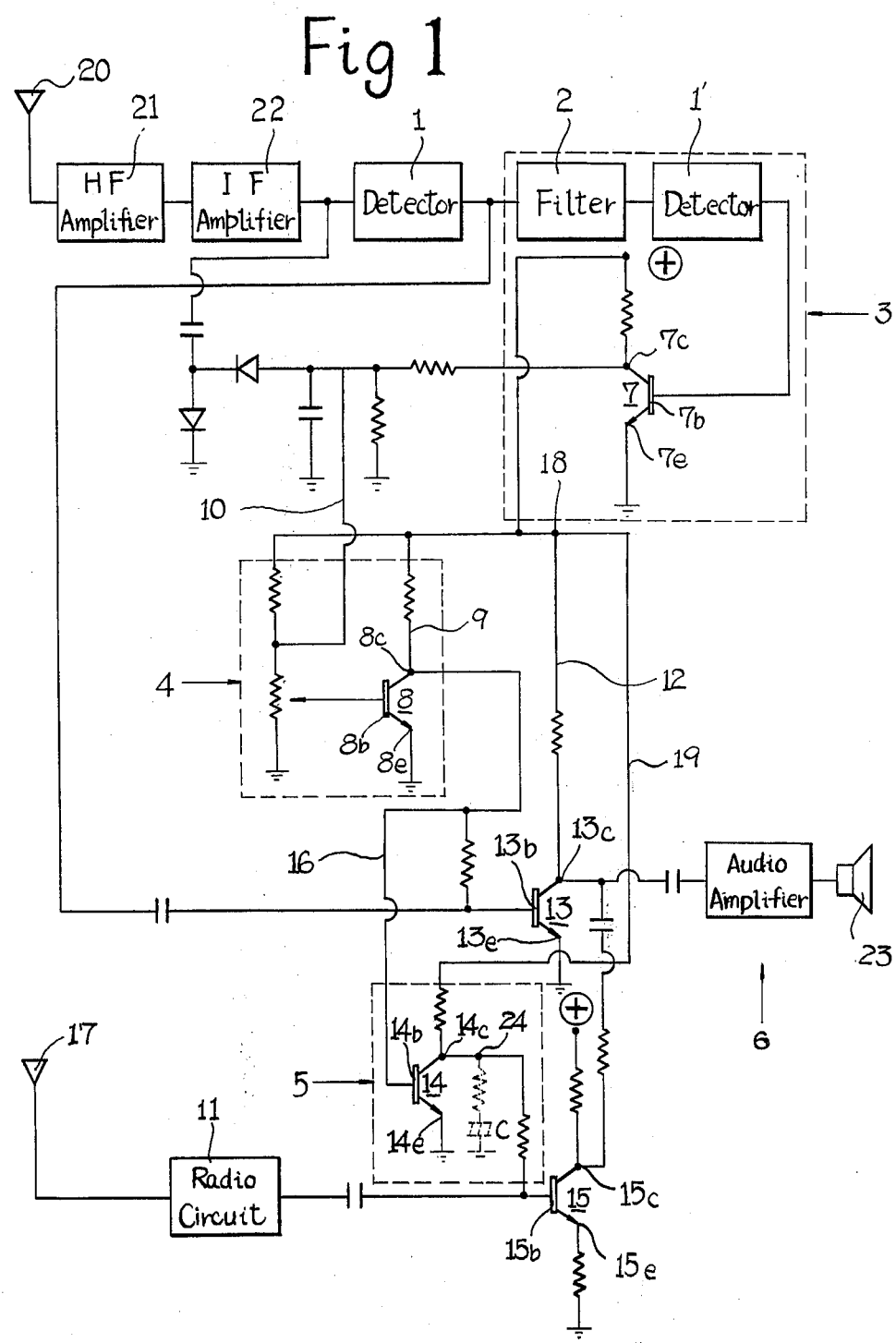
FIG. 1 is a combined schematic and block diagram of a radio and transceiver circuits which includes an automatic control system in accordance with one embodiment of the present invention.

Referring to FIG. 1, there is shown a combined radio and transceiver which incorporates an automatic control system in accordance with one embodiment of the present invention. The transceiver includes the antenna 20 which intercepts transceiver signals and couples them to the high frequency (HF) amplifier 21 and then to the intermediate frequency (IF) amplifier 22. An IF output signal from the IF amplifier 22 is applied to the detector 1 and the filter 2 wherein modulated wave is detected and filtered. The detected and filtered wave is applied to the detector 1' for further detection and for subsequent input to the transistor 7 at its base electrode 7b only when it is the desired wave.

With the transceiver signals input to the base electrode 7b, the transistor 7 becomes conductive or grounded. This results in voltage drop of the collector electrode 7c of the transistor 7 and positive voltage incrase of the circuit 9. On the other hand, an IF output signal from the IF amplifier 22 is applied to the squelch control circuit 4 through the circuit 10, resulting negative voltage increase in the circuit 10.

With both the positive voltage increase in the circuit 9 and the negative voltage increase in the circuit 10, the transistor 8 then conductive or grounded now becomes cut-off condition, resulting bias voltage development in the collector electrode 8c thereof. The bias voltage thus developed is input through the circuit 12 to the amplifying transistor 13 at the collector electrode 13c thereof. With both the bias voltage thus input to the collector electrode 13c and a branched signal voltage from the detector 1 applied to the transistor 13 at the base electrode 13b thereof, the transistor 13 is made operative, resulting the transceiver signal input to the audio amplifier 6 which in turn drives the speaker 23.

When the transceiver is operated as above, the bias voltage developed in the collector electrode 8c of the transistor 8 is input through the circuit 16 to the base electrode 14b of the switching transistor 14, while the positive voltage of the circuit 9 is input through the circuit 19 to the collector electrode 14c. Thus, the transistor 14 becomes conductive or grounded. And, accordingly the amplifying transistor 15 is made inoperative and thus any audio signal from the radio circuit generally identified at 11 can not be applied to the audio amplifier 6.

Thus, when the transceiver signal has been received, the radio signal then being applied to the audio amplifier 6 is automtically made switched off and now only the transceiver voice is audible.

When reception of any desired transceiver signal has been finished, positive voltage of the collector electrode 7c increases and thus positive voltage of the circuit 9 decreases. This makes the transistor 8 of the squelch control circuit 4 conductive and grounded, with such result that the amplifying transistor 13 stops its function. Consequently, bias voltage develops at the collector electrode 14c of the transistor 14 in the circuit 5. The bias voltage thus developed makes the amplifying transistor 15 operative and therefore the audio signal from the radio reception circuit 11 can be applied to audio amplifier 6, which in turn drives the speaker 23.

Further, as shown in broken or one-dot-chain line, there is connected at the junction 24 the time constant circuit, which comprises therein the electrolysis condenser C having high capacity, to the circuit connecting both the collector electrode 14c of the transistor 14 and the base electrode 15b of the transistor 15. In accordance with this configuration, there can be inserted a certain time interval of automatic switching operation between radio and transceiver signals. Therefore, even when transceiver signal interrupts temporarily, radio signal is not immediately input to the audio amplifier 6, and thus undesirable intervention by radio signal can be prevented during communication through the transceiver. Other reference numeral 17 in FIG. 1 is the radio antenna which intercepts radio signal.

Figure 2:
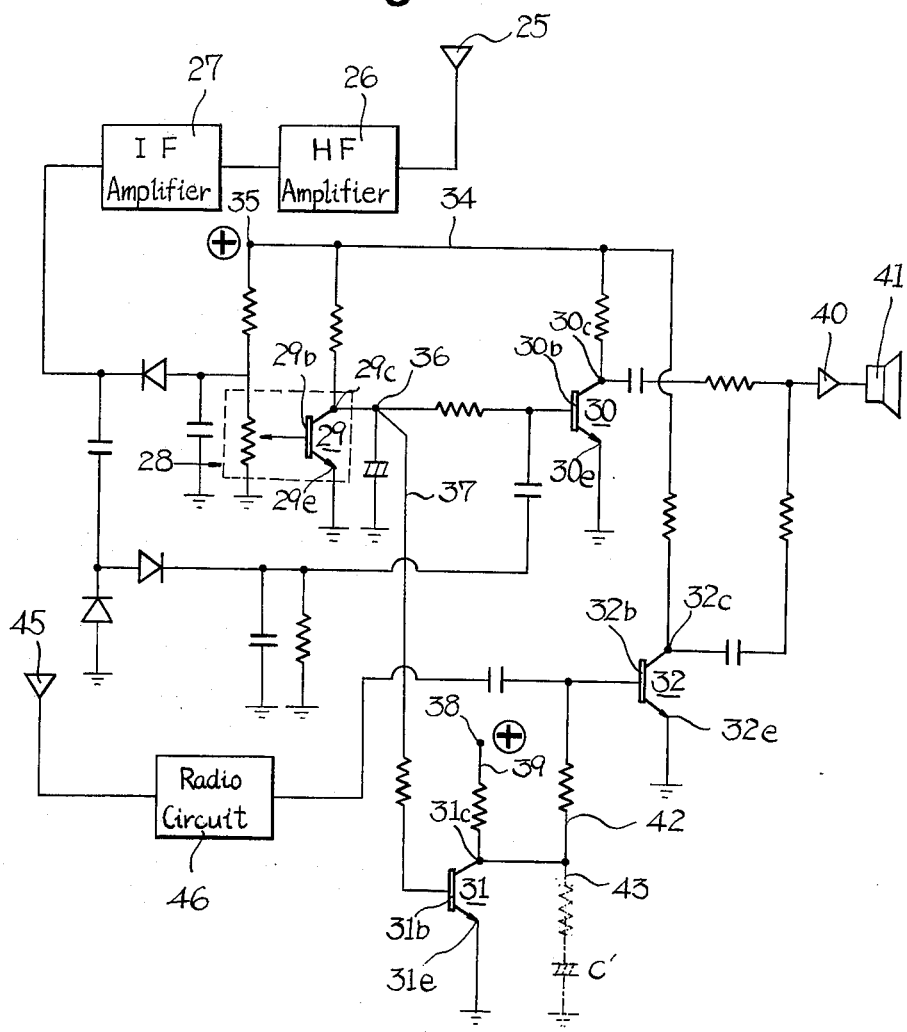
FIG. 2 is that of another embodiment.

Referring now to FIG. 2, there is shown another embodiment of the present invention. The transceiver also includes the antenna 25 which intercepts transceiver signal and couples them to the HF amplifier 26 and then to IF amplifier 27. An IF output signal from the IF amplifier 27 is input to the squelch control circuit 28, resulting negative voltage increase in the circuit 28. With the negative voltage input to the base electrode 29b of the switching transistor 29 which in turn is made cut-off, there is developed bias voltage at the collector electrode 29c. The bias voltage thus developed is then input through the circuit 33 to the amplifying transistor 30 at the base electrode 30b. With the positive voltage of the circuit 34 from the power source 35, the transistor 30 is made functional, resulting the transceiver signal input to the amplifying circuit 40 which in turn drives the audio speaker 41.

On the other hand, the positive voltage is applied through the circuit 37 which branched off at the junction 36 to the base electrode 31b of the switching transistor 31. With both the bias voltage thus input to the base electrode 31b and the positive voltage which is input to the collector electrode 31c through the circuit 39 from the power source 38, the transistor 31 becomes conductive or grounded. Accordingly, the amplifying transistor 32 is made inoperative and thus any audio signal from the radio can not be applied to the radio amplifying transistor 32.

When transceiver signal is not received or reception of the transceiver signal has been finished, the transistor 29 is made conductive or grounded, and thus there is not developed any bias voltage at the collector electrode 29c. The transistor 30 is consequently made inoperative, and on the other hand, there is developed bias voltage at the collector electrode 31c. The bias voltage thus developed is applied through the circuit 42 to the base electrode 32b of the amplifying transistor 32 which in turn becomes operative and amplifies the radio signal.

Further, as shown in broken or one-dot-chain line, there is also connected the time constant circuit 43 which comprises therein the electrolysis condenser C' having high capacity, to the circuit 42 in order to prevent undesirable premature switching. In FIG. 2, other reference numerals 45 and 46 are the radio antenna and radio circuit, respectively.

While particular embodiments of the present invention have been shown and described, it will be obvious to those skilled in the art that various changes and modifications may be made without departing from the invention in its broader aspects. The aim in the appended claims is to cover all such changes and modifications as fall within the true spirit and scope of the invention.

What is claimed is:

1. Automatic signal switching apparatus for interrupting the reproduction of audio signals from a source during the receipt of signals from a transceiver and reproducing the transceiver signals comprising signal reproducing means, a first amplifying transistor connected to said source to said reproducing means for feeding signals from said source to said reproducing means, a second amplifying transistor connected to said transceiver and to said reproducing means, a squelch control transistor having a base and emitter and collector electrodes, means applying a potential between the emitter and collector of said control transistor, means coupling the base of said control transistor to said transceiver to modify conductivity of said transistor upon receipt of a transceiver signal and produce a potential change of a least one of said electrodes, means couling the last said electrode to said first amplifying transistor to inactivate it upon the occurrence of said potential change and terminate the reproduction of said source signals and means coupling the last said electrode to said second amplifying transistor to activate it and feed said transceiver signals to said reproducing means whereby signals from said source will be reproduced during the absence of a transceiver signal and will be interrupted during the presence of a transceiver signal.

2. Automatic signal switching apparatus according to claim 1 including a time constant network interconnected with said control transistor to delay the reproduction of said source signals for a preselected period of time upon termination of said transceiver signals.

* * * * *